United States Patent
Chiozzi et al.

(10) Patent No.: US 6,175,478 B1
(45) Date of Patent: Jan. 16, 2001

(54) SHORT-CIRCUIT PROTECTION CIRCUIT, PARTICULARLY FOR POWER TRANSISTORS

(75) Inventors: Giorgio Chiozzi, Cinisello Balsamo; Bruno Marcone, Mezzanino, both of (IT)

(73) Assignee: STMicroelectronics S.r.l., Agrate Brianza (IT)

(*) Notice: Under 35 U.S.C. 154(b), the term of this patent shall be extended for 0 days.

(21) Appl. No.: 09/307,082

(22) Filed: May 7, 1999

(30) Foreign Application Priority Data

May 8, 1998 (EP) .................................................. 98830276

(51) Int. Cl.$^7$ ...................................................... H02H 3/00
(52) U.S. Cl. ........................... 361/93.1; 361/101; 361/86
(58) Field of Search ................... 361/86, 93.1, 100–101, 361/79, 87

(56) References Cited

U.S. PATENT DOCUMENTS

| | | | |
|---|---|---|---|
| 4,355,341 | 10/1982 | Kaplan ................................. | 361/79 |
| 5,008,586 | * 4/1991 | Miyazaki et al. ..................... | 323/315 |
| 5,272,392 | * 12/1993 | Wong et al. ......................... | 327/109 |
| 5,343,141 | * 8/1994 | Metro et al. ......................... | 323/288 |
| 5,369,308 | * 11/1994 | Schoofs et al. ....................... | 327/427 |
| 5,786,970 | * 7/1998 | Nao et al. ............................. | 361/18 |
| 5,903,422 | * 5/1999 | Hosokawa ............................ | 361/93.1 |

FOREIGN PATENT DOCUMENTS

| | | |
|---|---|---|
| 0 772 273 | 5/1997 | (EP) . |
| 2 214 745 | 9/1989 | (GB) . |

* cited by examiner

Primary Examiner—Michael J. Sherry
(74) Attorney, Agent, or Firm—Theodore E. Galanthay; Robert Iannucci; Seed Intellectual Property Law Group PLLC

(57) ABSTRACT

A short-circuit protection circuit, particularly for power transistors, contains a first circuit for mirroring the output current of a power transistor which is parallel-connected to the power transistor, and a second mirroring circuit which is series-connected to the first mirroring means and is adapted to emit a current which is correlated to the current mirrored by the first mirroring circuit, for comparison with a reference current. The result of the comparison determines the need to intervene or not on the power transistor. The short-circuit protection circuit may also contain a circuit for sensing the voltage drop across the power transistor which is parallel-connected to the power transistor and to the first mirroring circuit, in order to adjust minimum and maximum values of the current in output from the power transistor, as a function of the voltage that is present across the transistor.

22 Claims, 2 Drawing Sheets

SHORT-CIRCUIT PROTECTION CIRCUIT, PARTICULARLY FOR POWER TRANSISTORS

TECHNICAL FIELD

The present invention relates to a short-circuit protection circuit, particularly for power transistors.

BACKGROUND OF THE INVENTION

It is known that many integrated circuits use protections against short-circuits to control the maximum current that flows through the power transistors. In some applications it is important that the power transistor be able to supply a small current also when high voltages are applied to its terminals.

In single power-supply audio applications, during power-on transients the power transistor must charge the decoupling capacitor, which is connected between the loudspeaker and the output of the power stage, while the entire power supply voltage is applied to the terminals of the power transistor.

In such a situation, it is important to ensure that the power transistor is capable of supplying the current required to charge said capacitor, so that the amplifier can power-on correctly.

FIG. 1 illustrates a conventional protection circuit, in which the reference numeral 1 designates the power transistor and the reference numeral 2 designates a so-called sense resistor, which is suitable to sense the output current Io and is arranged in series to the power transistor 1, a current mirror Q1, Q2 with corresponding current sources Io and Iref which are series-connected, and finally a circuit branch which is connected between the ground and the bases of the transistors Q1 and Q2 and is constituted by a resistor 3 which is series-connected to a Zener diode 4.

At a point that is intermediate between the transistor Q2 and the current source Iref, a pin is provided for acquiring the signal for indicating intervention or lack thereof on the power transistor 1 in order to limit the maximum voltage across it.

The resistor 3 senses the voltage drop on the power transistor 1. When he voltage across the transistor exceeds the value $$\text{Vds\_Max} = RI_{ref}\frac{A2}{A1} + V_Z$$

the protection circuit disconnects the power transistor 1 and no current can be supplied anymore: this limits the maximum supply voltage.

In the above relation, the terms A2 and A1 are, respectively, the areas of the transistors Q2 and Q1, while Vds_Max is the maximum voltage between the drain and the source of the power transistor 1 and $V_z$ is the voltage across the Zener diode 4.

SUMMARY OF THE INVENTION

The aim of embodiments of the present invention is therefore to provide a short-circuit protection circuit, particularly for power transistors, in which means are provided for determining the maximum and minimum values of the output current of the power transistor as a function of the voltage applied to its drain and source terminals.

Within the scope of this aim, an advantage of the present invention is that it provides a short-circuit protection circuit, particularly for power transistors, which occupies a reduced area.

Another advantage of the present invention is that it provides a short-circuit protection circuit, particularly for power transistors, which is highly reliable, relatively easy to manufacture and at competitive costs.

This aim, these advantages and others which will become apparent hereinafter are achieved by a short-circuit protection circuit, particularly for power transistors, having first means for mirroring the output current of a power transistor which are parallel-connected to said power transistor, and second mirroring means which are series-connected to said first mirroring means and are suitable to emit a current which is correlated to the current mirrored by said first mirroring means, for comparison with a reference current. The result of said comparison determines the need to intervene or not on said power transistor. The short-circuit protection circuit also includes means for sensing the voltage drop across said power transistor which are parallel-connected to said power transistor and to said first mirroring means, in order to adjust minimum and maximum values of the current in output from said power transistor, as a function of the voltage that is present across said transistor.

BRIEF DESCRIPTION OF THE DRAWINGS

Further characteristics and advantages of the invention will become apparent from the description of a preferred but not exclusive embodiment of the circuit according to the invention, illustrated only by way of non-limitative example in the accompanying drawings.

DETAILED DESCRIPTION OF THE INVENTION

Figure 1:
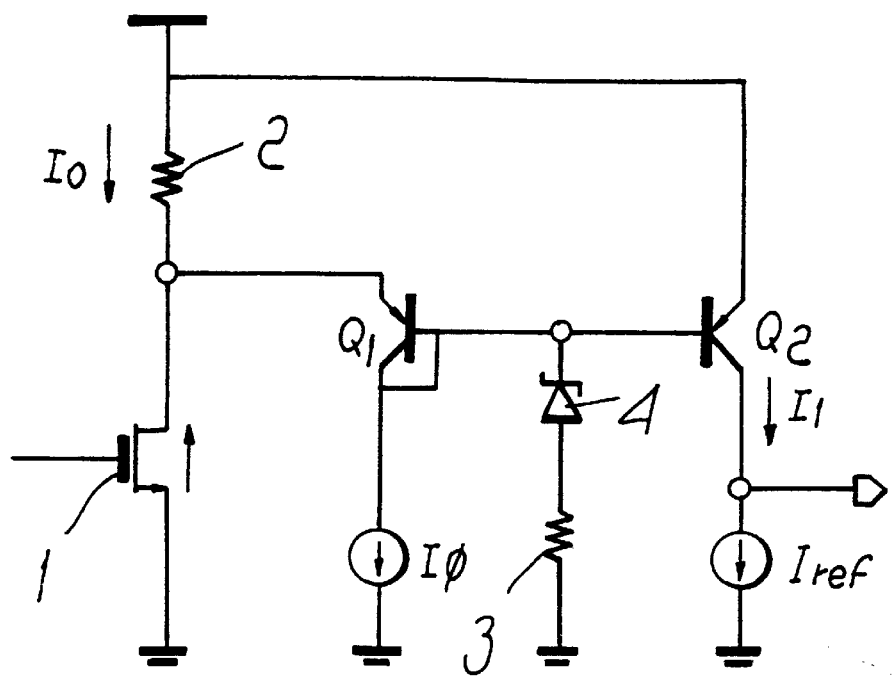
FIG. 1 is a circuit diagram of a conventional protection circuit.

With reference to the above figures, the protection circuit according to the present invention, generally designated by the reference numeral 10, comprises first means 11 for mirroring the output current of a power transistor 12.

The mirroring means are conveniently constituted by a MOS transistor which is parallel-connected to the power transistor 12 so that its gate terminals are common-connected, although other acceptable mirroring circuits could be used.

Second mirroring means, conveniently constituted by bipolar transistors 13 and 14 with common-connected base terminals, are series-connected to the first mirroring means 11. In particular, the collector terminal of the bipolar transistor 13 is connected to the drain terminal of the transistor 11, while its emitter terminal is connected to the drain terminal of the power transistor 12.

In the bipolar transistor 14, instead, the emitter terminal is connected to the drain terminal of the power transistor 12 and the collector terminal is connected to a reference current source 15, which generates a reference current Iref.

The bipolar transistor 13 is diode-connected.

Figure 2:
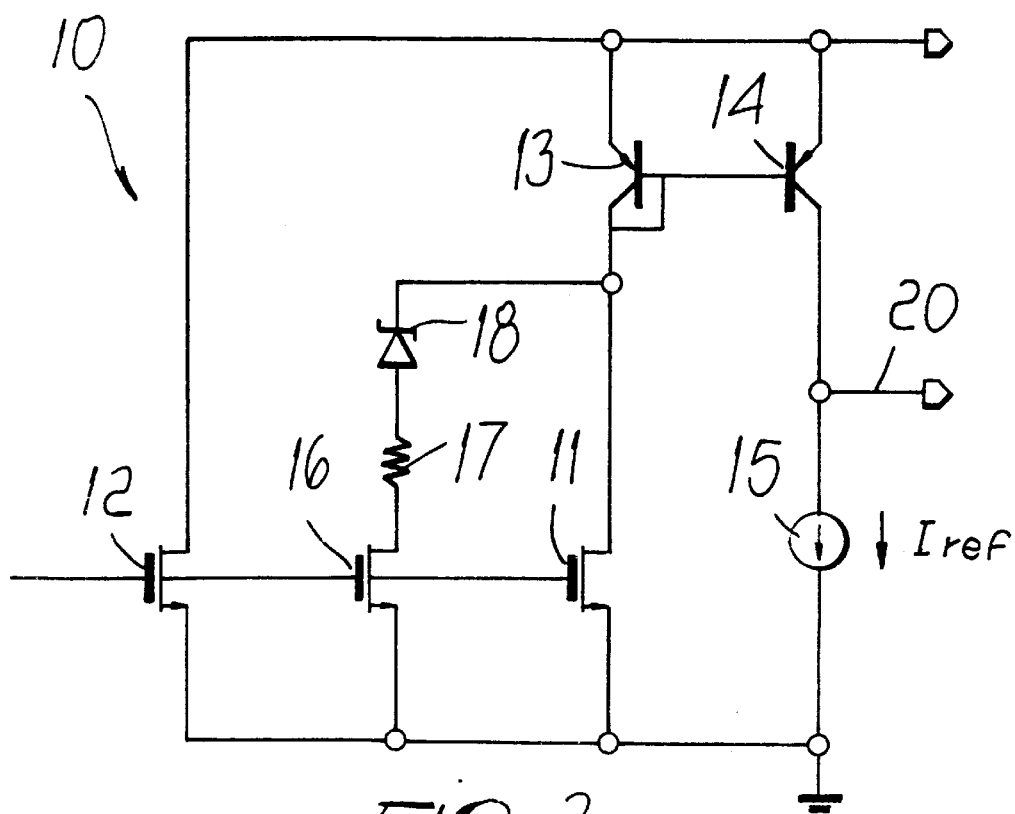
FIG. 2 is a conceptual circuit diagram of the short-circuit protection circuit according to the present invention.

FIG. 2 illustrates the case of a protection circuit applied to one of the two power transistors usually used in a final power stage. In particular, the case of FIG. 2 is the one in which the protection circuit is applied to the power transistor whose source terminal is connected to the ground and whose drain terminal constitutes the output of the final power stage.

The above-described circuit can likewise be used also in the case of a power transistor whose drain terminal is connected to the supply voltage and whose source terminal constitutes the output of the final power stage.

The circuit according to an embodiment of the invention further comprises means for sensing the voltage drop across the power transistor 12; said means are parallel-connected to the power transistor 12 and to the first mirroring means The means for sensing the voltage drop across the power transistor 12 comprises a second MOS transistor 16, whose gate terminal is common-connected to the gate terminal of the power transistor 12 and whose source terminal is connected to the source terminal of the power transistor. A resistor 17 is series-connected to the drain terminal of the second MOS transistor 16, and a Zener diode 18 is in turn series-connected to said resistor 17; the anode terminal of said Zener diode 18 is connected to the collector terminal of the bipolar transistor 13.

The area of the first MOS transistor 11 is much smaller than the area of the second MOS transistor 16.

A signal, designated by the reference numeral 20, is acquired in an intermediate point between the collector terminal of the bipolar transistor 14 and the current source 15; said signal provides an indication as to the need to intervene or not on the power transistor 12 to reduce its supplied current.

With reference now to FIG. 2, the operation of the circuit according to the invention is as follows.

The output current of the power transistor 12 is sensed by mirroring the power transistor 12 by means of the MOS transistor 11 and then by means of the bipolar transistors 13 and 14 on the output, i.e., in the comparison mode wherefrom the signal 20 is output, in order to compare said current with the reference current set by the reference current source 15.

The effect of the resistor 17 is to decrease the current supplied by the power transistor 12 until the voltage across the power transistor 12 is high enough to cause the current flowing through the resistor R to be equal to the current mirrored by the MOS transistor 16.

The transistor 16 behaves like a switch when low voltages are applied across the power transistor 12 and instead acts as a current source when high voltages are applied across the same transistor.

In the second case, the resistor 17 has no effect and the maximum current is set by the area ratios of the transistors and by the reference current Iref.

Explicitly with reference now to the circuit of FIG. 2, when a low voltage (Vds) is applied between the drain terminal and the source terminal of the power transistor 12, no current flows through the MOS transistor 16. The protection current can be calculated by making the current supplied by the bipolar transistor 14 equal to the reference current Iref. Therefore:

$$I_{out}\frac{A_{11}}{A_{12}} = I_{ref}$$

where $A_{11}$ is the area of the MOS transistor 11 and likewise $A_{12}$ is the area of the power transistor 12, while $I_{out}$ is the current in output from the power transistor 12.

Solving the above equation as a function of $I_{out}$ provides the expression of the protection current at low voltage:

$$I_{outLV} = I_{ref}\frac{A_{12}}{A_{11}}$$

when the voltage between the drain and the source of the power transistor 12 is higher than the voltage across the Zener diode 18, a certain current flows through the resistor 17, lowering the protection current, in a manner which is linear with respect to the increase in voltage across the terminals of the power transistor. Ignoring the voltage drop between the base and the emitter of the bipolar transistor 13, it is possible to obtain:

$$I_{out}\frac{A_{11}}{A_{12}} + \frac{V_{DS} - V_Z}{R} = I_{ref}$$

wherefrom, by solving as a function of the output current $I_{out}$, the expression of the protection current is obtained as a function of the voltage drop across the power transistor 12.

Accordingly, the following relation applies:

$$I_{out} = \left(I_{ref} - \frac{V_{DS} - V_Z}{R}\right)\frac{A_{12}}{A_{11}}$$

where $I_{out}$ is the current of the safe operating area of the power transistor 12.

When the voltage across the power transistor 12 increases, the second MOS transistor 16 becomes a current source and no further dependence of the protection current from the voltage across the drain and source terminals of the power transistor 12 is observed. This occurs when the current flowing through the MOS transistor 16 equals the current flowing through the resistor 17:

$$V_{DS} = RI_{ref}\frac{A_{16}}{A_{16} + A_{11}} + V_Z$$

In this condition, the protection current can be calculated by rendering the sum of the current mirrored by the transistors 16 and 11 equal to the reference current Iref:

$$I_{out}\frac{A_{16} + A_{11}}{A_{12}} = I_{ref}$$

Solving as a function of the output current $I_{out}$ produces the expression of he high-voltage protection current applied to the drain and source terminals of the power transistor 12:

$$I_{outHV} = I_{ref}\frac{A_{12}}{A_{16} + A_{11}}$$

Figure 3:
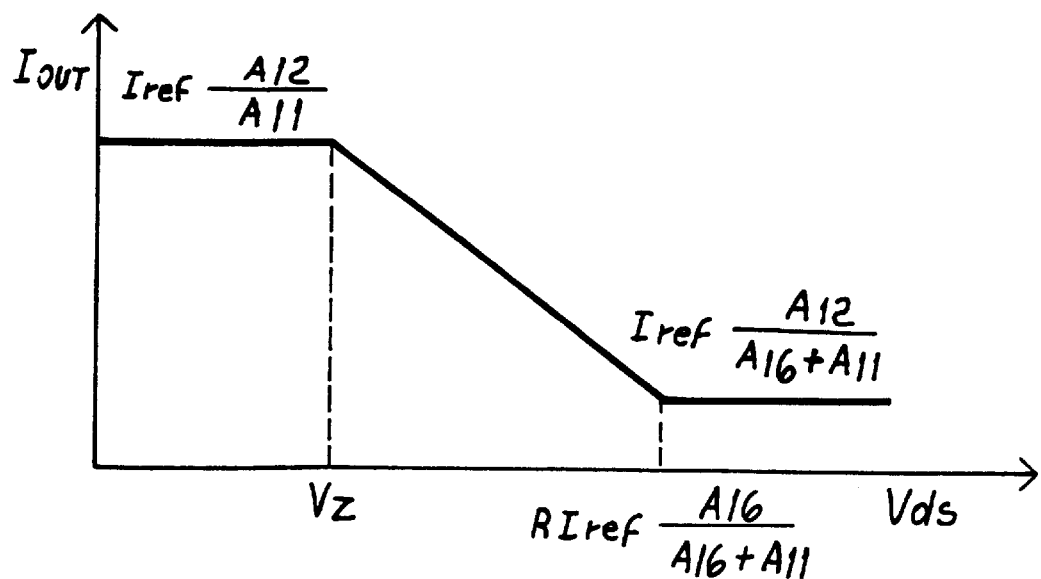
FIG. 3 is a chart which plots the protection curve that can be obtained with the circuit according to the present invention.

FIG. 3 plots the resulting protection curve, wherein the axis of the ordinates represents the output current $I_{out}$ of the power transistor and the axis of the abscissae represents the voltage across the drain and source terminals of the power transistor 12.

It is evident that for voltage values Vds below the voltage across the Zener diode 18, Vz, the protection curve is flat and parallel to the axis of the abscissae, while for voltages applied to the power transistor 12 which are higher than the Zener voltage Vz the curve descends in a linear manner as the voltage Vds increases, until it settles again so that it is parallel to the axis of the abscissae for voltage values exceeding a certain value thereof, equal to:

$$\frac{A_{16}}{A_{16} + A_{11}} = RI_{ref}$$

Figure 4:
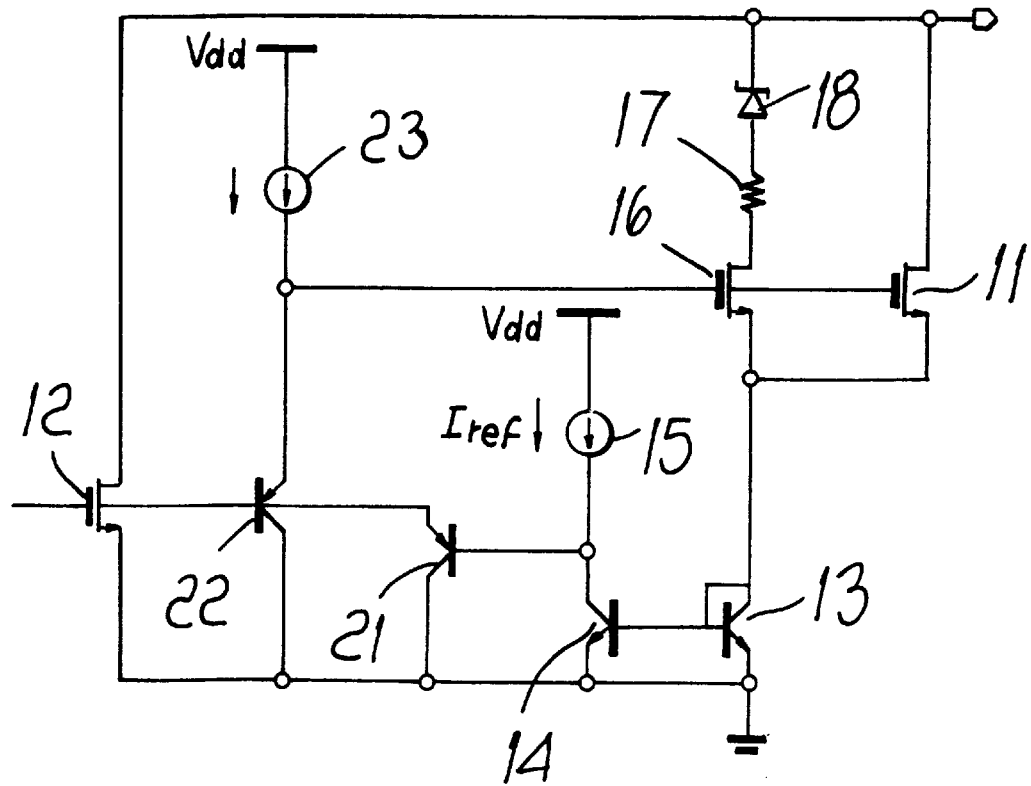
FIG. 4 is a circuit diagram of a practical implementation of the circuit shown in FIG. 2.

FIG. 4 shows a particular implementation of the circuit according to another embodiment of the invention. The circuit, similar to the one shown in FIG. 2, differs in that the output of the circuit, taken between the collector terminal of the bipolar transistor 14 and the source 15, is connected to the base terminal of a third bipolar transistor 21, whose emitter terminal is common-connected to the gate terminal of the power transistor 12 and whose collector terminal is common-connected to the source terminal of the power transistor 12.

The transistor 21 of the PNP type limits the gate voltage of the power transistor 12, thus limiting the output current of said transistor.

A fourth PNP transistor 22 is connected so that its base terminal is common-connected to the gate terminal of the power transistor 12 and its collector terminal is common-connected to the source terminal of the power transistor 12.

The emitter terminal of the transistor 22 is biased by a biasing current source 23, which is connected to the supply voltage $V_{dd}$.

The transistor 22 is necessary because in the circuit layout of FIG. 4 the second mirroring means 15 are connected to the ground, while the branch with the transistor 16, the resistor 17 and the Zener diode 18 is connected to the output of the final power stage.

In practice it has been observed that the circuit according to embodiments of the present invention fully achieves the intended aim.

The circuit thus conceived is susceptible of numerous modifications and variations, all of which are within the scope of the inventive concept; all the details may also be replaced with other technically equivalent elements.

In practice, the materials employed, so long as they are compatible with the specific use, as well as the dimensions, may be any according to requirements and to the state of the art.

We claim:

1. A short-circuit protection circuit, particularly for power transistors, comprising:
    first means for mirroring the output current of a power transistor which are parallel-connected to said power transistor;
    second mirroring means which are series-connected to said first mirroring means and are suitable to emit a current which is correlated to the current mirrored by said first mirroring means, for comparison with a reference current; the result of said comparison determining the need to intervene or not on said power transistor; and
    means for sensing the voltage drop across said power transistor which are parallel-connected to said power transistor and to said first mirroring means, in order to adjust minimum and maximum values of the current in output from said power transistor, as a function of the voltage that is present across said transistor.

2. The protection circuit according to claim 1 wherein said first mirroring means comprise a first MOS transistor in which the gate terminal and the source terminal are common-connected to the gate terminal and the source terminal of the power transistor.

3. The protection circuit according to claim 1 wherein said second mirroring means comprise a pair of bipolar transistors in which the base terminals are common-connected, a first transistor of said pair of bipolar transistors being diode-connected, the emitter terminals of said pair of bipolar transistors being connected to the drain terminal of said power transistor.

4. The protection circuit according to claim 3 wherein in said first transistor of the pair of bipolar transistors the collector terminal is connected to the drain terminal of said MOS transistor of the first mirroring means.

5. The protection circuit according to claim 3 wherein in the second bipolar transistor of said pair of bipolar transistors, the collector terminal is connected to a current source which is adapted to generate said reference current.

6. The protection circuit according to claim 1 wherein said means for sensing the voltage drop across said power transistor comprise a second MOS transistor in which the gate terminal and the source terminal are common-connected to the gate terminal and the source terminal of the power transistor.

7. The protection circuit of claim 6 wherein said means for sensing the voltage drop across the power transistor further comprise a resistor and a Zener diode which are series-connected between the drain terminal of said second MOS transistor and a point which is intermediate between the collector terminal of the first bipolar transistor and the source terminal of said first MOS transistor of said first mirroring means.

8. The protection circuit of claim 4 wherein the comparison with the reference current is performed in a point between the collector terminal of said second bipolar transistor and said reference current source, the signal sensed in said intermediate point giving an indication of the need to intervene or not on said power transistor.

9. The protection circuit according to claim 7 wherein said Zener diode is connected to said resistor with its collector terminal.

10. The protection circuit according to claim 1, further comprising:
    a third bipolar transistor which receives in input, at its base terminal, said signal indicating the need or not to intervene on said power transistor, the emitter terminal of said third bipolar transistor being connected to the gate terminal of said power transistor and its collector terminal being connected to the source terminal of said power transistor.

11. The protection circuit according to claim 2 wherein the area of said first MOS transistor is much smaller than the area of a second MOS transistor in said means for sensing the voltage drop across said power transistor.

12. A short-circuit protection circuit comprising:
    a power transistor;
    a first current mirror circuit coupled in parallel to the power transistor;
    a second current mirror circuit coupled in series to the first current mirror circuit, and structured to output a current proportional to a current output of the first current mirror circuit, the output of the second current mirror circuit compared to a reference current; and
    a voltage-drop circuit coupled in parallel to the power transistor and structured to sense a voltage drop across the power transistor and for changing currents output from the power transistor relative to the voltage drop.

13. The protection circuit of claim 12 wherein the first current mirror circuit comprises a first MOS transistor having a gate terminal coupled to a gate terminal of the power transistor, and having a source terminal coupled to a source terminal of the power transistor.

14. The protection circuit of claim 13 wherein the second current mirror circuit comprises a first and a second bipolar transistor having base terminals coupled together, the first bipolar transistor being diode-connected, and emitter terminals of both bipolar transistor coupled to a drain terminal of the power transistor.

15. The protection circuit of claim 14 wherein a collector terminal of the first bipolar transistor is coupled to a drain terminal of the first MOS transistor of the first current mirror circuit.

16. The protection circuit of claim 14 wherein a collector terminal of the second bipolar transistor is coupled to a current source structured to generate the reference current.

17. The protection circuit of claim 12 wherein the voltage-drop circuit includes a MOS transistor having gate and source terminals respectively coupled to the gate and source terminals of the power transistor.

18. The protection circuit of claim 17 wherein the voltage-drop circuit further includes a resistor and a Zener diode that are serially coupled between the drain terminal of the MOS transistor and the second current mirror circuit.

19. The protection circuit of claim 16 wherein a comparison of the output of the second current mirror to the reference current is able to be performed at a point between the collector terminal of the second bipolar transistor and to a source of the reference current.

20. The protection circuit of claim 18 wherein the Zener diode is coupled to the resistor with its collector terminal.

21. The protection circuit of claim 14, further comprising:
a third bipolar transistor structured to receive an input at its base terminal, the signal indicating whether to intervene on the power transistor;
wherein an emitter terminal of the third bipolar transistor is connected to a gate terminal of the power transistor and a collected terminal of the third bipolar transistor is coupled to a source terminal of the power transistor.

22. The protection circuit according to claim 12 wherein the area of a first MOS transistor in the first current mirror circuit is smaller than the area of a second MOS transistor in the voltage-drop circuit.

* * * * *

UNITED STATES PATENT AND TRADEMARK OFFICE
CERTIFICATE OF CORRECTION

PATENT NO. : 6,175,478 B1
DATED : January 16, 2001
INVENTOR(S) : Giorgio Chiozzi et al.

Page 1 of 1

It is certified that error appears in the above-identified patent and that said Letters Patent is hereby corrected as shown below:

Column 6, claim 12,
Line 61, "changing currents output" should read -- changing current output --.

Column 7, claim 14,
Line 5, "both bipolar transistor" should read -- both bipolar transistors --.

Signed and Sealed this

Twelfth Day of March, 2002

*Attest:*

JAMES E. ROGAN
*Attesting Officer*    *Director of the United States Patent and Trademark Office*